United States Patent
Ishii et al.

(10) Patent No.: US 8,310,137 B2
(45) Date of Patent: Nov. 13, 2012

(54) RESONATOR ELEMENT AND RESONATOR

(75) Inventors: Masahiro Ishii, Suwa (JP); Takeo Funakawa, Chino (JP)

(73) Assignee: Seiko Epson Corporation, Tokyo (JP)

(*) Notice: Subject to any disclaimer, the term of this patent is extended or adjusted under 35 U.S.C. 154(b) by 438 days.

(21) Appl. No.: 12/704,450

(22) Filed: Feb. 11, 2010

(65) Prior Publication Data

US 2010/0201223 A1 Aug. 12, 2010

(30) Foreign Application Priority Data

Feb. 12, 2009 (JP) .................................. 2009-029895

(51) Int. Cl.
*H01L 41/08* (2006.01)
*H03H 9/19* (2006.01)

(52) U.S. Cl. ..................................... 310/370; 73/514.02

(58) Field of Classification Search .................... 310/370
See application file for complete search history.

(56) References Cited

U.S. PATENT DOCUMENTS 8,136,398 B2 * 3/2012 Kurihara .................... 73/504.12

FOREIGN PATENT DOCUMENTS

| JP | A-2008-224627 | | 9/2008 |
|---|---|---|---|
| JP | 2009005024 A | * | 1/2009 |
| JP | 2009055390 A | * | 3/2009 |
| JP | 2010187195 A | * | 8/2010 |
| JP | 2010187196 A | * | 8/2010 |
| JP | 2010187197 A | * | 8/2010 |
| JP | 2011082782 A | * | 4/2011 |
| JP | 2012029024 A | * | 2/2012 |

* cited by examiner

*Primary Examiner* — J. San Martin
(74) *Attorney, Agent, or Firm* — Oliff & Berridge, PLC (57) ABSTRACT

A resonator element includes: three or more resonating arms, each of the resonating arms including; a lower electrode provided on a first surface of the resonating arm, a piezoelectric film formed on the lower electrode, an upper electrode formed on the piezoelectric film, a first wiring line coupled to the lower electrode, and a second wiring line coupled to the upper electrode; and a base to which the resonating arms are connected. In the resonator element, the resonating arm vibrates in a thickness direction of the resonating arm. The resonating arms adjacent to each other vibrate in opposite directions from each other. The first surface is opposed to a second surface in the thickness direction. The second wiring line is drawn out to the second surface through side surfaces of the resonating arm so as to surround the resonating arm.

7 Claims, 9 Drawing Sheets

RESONATOR ELEMENT AND RESONATOR

BACKGROUND

1. Technical Field

The present invention relates to a resonator element having resonating arms, and a resonator.

2. Related Art

In a resonator having a resonating arm, a resonator element is known in which the resonating arm vibrates in a thickness direction thereof in addition to one in which the resonating arm vibrates in a plane as flexural vibrations. The resonator element generally has a plurality of resonating arms so as to perform walk-mode vibration in which the resonating arms adjacent to each other alternatively vibrate in opposite directions from each other.

JP-A-2008-224627 is an example of related art. The example discloses an angular velocity sensor using the walk-mode vibration. The angular velocity sensor has three arms (resonating arms) formed of silicon, for example. On one surface of each arm, a lower-layer electrode (lower electrode), a piezoelectric thin film (piezoelectric film), and an upper-layer electrode (upper electrode) are formed in this order. The lower-layer electrode, the piezoelectric thin film, and the upper-layer electrode form a piezoelectric element. Thus, each of the resonating arms can vibrate in a thickness direction of a resonator element by the reverse piezoelectric effect of the piezoelectric thin film. A polarity of each electrode is set such that the arms adjacent to each other vibrate in opposite directions from each other.

In the resonator element, wiring lines respectively coupled to the lower-layer electrode and the upper-layer electrode are arranged on one surface of the resonator element so as not to intersect with each other. Therefore, the arrangement of wiring lines becomes complex and a large area is required for the arrangement.

In the configuration disclosed in the example, the area of the resonator element decreases and it becomes hard to ensure wiring paths especially when the resonator needs to be downsized. As a result, it is hard to realize the miniaturization of the resonator element.

SUMMARY

The invention is proposed in order to solve the above-mentioned problems and can be achieved by the following aspects.

According to a first aspect of the invention, a resonator element includes: three or more resonating arms, each of the resonating arms including; a lower electrode provided on a first surface of the resonating arm, a piezoelectric film formed on an upper side than the lower electrode, an upper electrode formed on an upper side than the piezoelectric film, a first wiring line coupled to the lower electrode, and a second wiring line coupled to the upper electrode; and a base to which the resonating arms are connected. In the resonator element, the resonating arm vibrates in a thickness direction of the resonating arm. The resonating arms adjacent to each other vibrate in opposite directions from each other. The first surface is opposed to a second surface in the thickness direction. The second wiring line is drawn out to the second surface through side surfaces of the resonating arm so as to surround the resonating arm with the second wiring line.

According to the configuration, the wiring line coupled to the upper electrode is drawn out to the second surface through the side surfaces of the resonating arm from the first surface so as to surround the resonating arm. The wiring line is drawn out from the first surface to the second surface, which is the back surface of the first surface. Thus, it is possible to easily draw out the wiring line to the back surface. Since the front and back surfaces of the resonator element can be utilized for the arrangement of wiring line, an area that can be used for the arrangement of wiring line is increased. As a result, the degree of arrangement freedom of the wiring line is increased. Further, the wiring line can be arranged in a limited space, being able to achieve miniaturization of the resonator element.

In the resonator element above, a mounting electrode coupled to the first and second wiring lines is preferably formed at an end of the base.

According to the configuration, the mounting electrode coupled to the wiring lines is formed at the end of the base of the resonator element. The upper and lower electrodes can be electrically conducted to a container to which the resonator element is housed, for example, through the mounting electrode. Further, the resonator element can be kept in a cantilever structure by fixing the resonator element to the mounting electrode with a conductive adhesive, for example. Thus, characteristics of the resonator element can be desirably achieved.

In the above resonator element, the base is preferably formed thicker than the resonating arm, and a portion of the base at which the resonating arm is connected to the base is preferably formed such that a thickness of the portion continuously increases from the resonating arm toward the base.

According to the configuration, in the resonator element in which the base is formed thicker than the resonating arm, the portion of the base is formed such that the thickness thereof continuously increases from the resonating arm toward the end of the base. The connecting portion between the base and the resonating arm is inclined. The wiring line drawn out to the base from the resonating arm is coupled to the mounting electrode and the like through the inclined surface. In a case where the resonating arm and the base are connected without forming the inclined surface, a step is formed at a boundary between the resonating arm and the base. In the first aspect, since the connecting portion has the inclined surface, the wiring line does not cross a sharp edge compared with a case where the wiring line crosses the step. Accordingly, it is possible to prevent disconnections of wiring line at the connecting surface. In addition, since no step is formed at the connecting portion between the resonating arm and the base, exposure of photoresist is securely performed in a case where photolithography is employed for forming the wiring line. As a result, the wiring line can be easily formed without any disconnection.

According to a second aspect of the invention, a resonator element includes: three or more resonating arms, each of the resonating arms including; a lower electrode provided on a first surface of the resonating arm, a piezoelectric film formed on the lower electrode, an upper electrode formed on the piezoelectric film, a first wiring line coupled to the lower electrode, and a second wiring line coupled to the upper electrode; and a base to which the resonating arms are connected. In the resonator element, the resonating arm vibrates in a thickness direction of the resonating arm. The resonating arms adjacent to each other vibrate in opposite directions from each other. The first surface is opposed to a second surface in the thickness direction. The first wiring line is drawn out to the second surface through side surfaces of the resonating arm so as to surround the resonating arm.

According to the configuration, the wiring line coupled to the lower electrode is drawn out to the second surface through the side surfaces of the resonating arm from the first surface so as to surround the resonating arm. The wiring line is drawn out from the first surface to the second surface, which is the back surface of the first surface. Thus, it is possible to easily draw out the wiring line to the back surface. Since the front and back surfaces of the resonator element can be utilized for the arrangement of wiring line, an area that can be used for the arrangement of wiring line is increased. As a result, the degree of arrangement freedom of the wiring line is increased. Further, the wiring line can be arranged in a limited space, being able to achieve miniaturization of the resonator element.

In the resonator element above, a mounting electrode coupled to the first and second wiring lines is preferably formed at an end of the base.

According to the configuration, the mounting electrode coupled to the wiring lines is formed at the end of the base of the resonator element. The upper and lower electrodes can be electrically conducted to a container to which the resonator element is housed, for example, through the mounting electrode. Further, the resonator element can be kept in a cantilever structure by fixing the resonator element to the mounting electrode with a conductive adhesive, for example. Thus, characteristics of the resonator element can be desirably achieved.

In the above resonator element, the base is preferably formed thicker than the resonating arm, and a portion of the base at which the resonating arm is connected to the base is preferably formed such that a thickness of the portion continuously increases from the resonating arm toward the base.

According to the configuration, in the resonator element in which the base is formed thicker than the resonating arm, the portion of the base is formed such that the thickness thereof continuously increases from the resonating arm toward the end of the base. The connecting portion between the base and the resonating arm is inclined. The wiring line drawn out to the base from the resonating arm is coupled to the mounting electrode and the like through the inclined surface. In a case where the resonating arm and the base are connected without forming the inclined surface, a step is formed at a boundary between the resonating arm and the base. In the second aspect, since the connecting portion has the inclined surface, the wiring line does not cross a sharp edge compared with a case where the wiring line crosses the step. Accordingly, it is possible to prevent disconnections of wiring line at the connection surface. In addition, since no step is formed at the connecting portion between the resonating arm and the base, exposure of photoresist is securely performed in a case where photolithography is employed for forming the wiring line. As a result, the wiring line can be easily formed without any disconnection.

According to a third aspect of the invention, a resonator includes the resonator element according to the first aspect and a container housing the resonator. In the resonator, the resonator element is hermetically housed in the container.

According to the configuration, since the above-described resonator element is housed in the container, it is possible to miniaturize the resonator element. As a result, it is possible to provide a miniaturized resonator element.

BRIEF DESCRIPTION OF THE DRAWINGS

The invention will be described with reference to the accompanying drawings, wherein like numbers reference like elements.

FIGS. 5A and 5B show wiring lines coupled to lower electrodes. FIG. 5A is a schematic plan view showing a front surface while

FIG. 5A is a schematic plan view showing a front surface while

FIGS. 13A and 13B show wiring lines coupled to lower electrodes. FIG. 13A is a schematic plan view showing a front surface while

FIGS. 14A and 14B show wiring lines coupled to upper electrodes. FIG. 14A is a schematic plan view showing a front surface while

FIGS. 16A and 16B show a configuration of a resonator according to a third embodiment. FIG. 16A is a schematic plan view while

DESCRIPTION OF EXEMPLARY EMBODIMENTS

Hereinafter, embodiments of the invention will be described with reference to the accompanying drawings. Note that scales of members in the drawings referred to hereinafter are adequately changed so that they can be recognized.

First Embodiment

Figure 1:
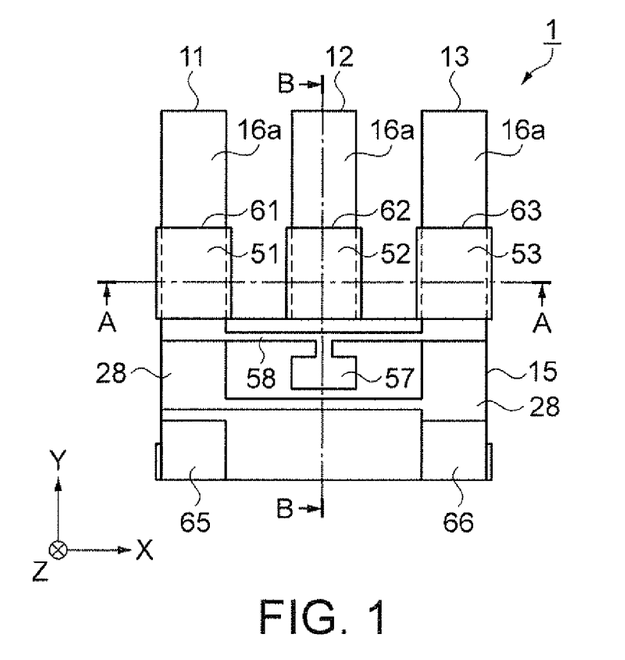
FIG. 1 is a schematic plan view showing a configuration of a resonator element according to a first embodiment.
Figure 2:
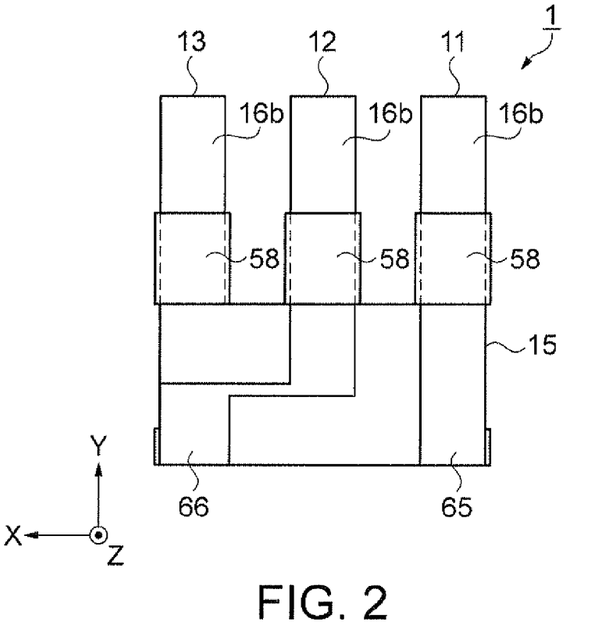
FIG. 2 is a schematic plan view showing a configuration of a back surface of the resonator element according to the first embodiment.
Figure 3:
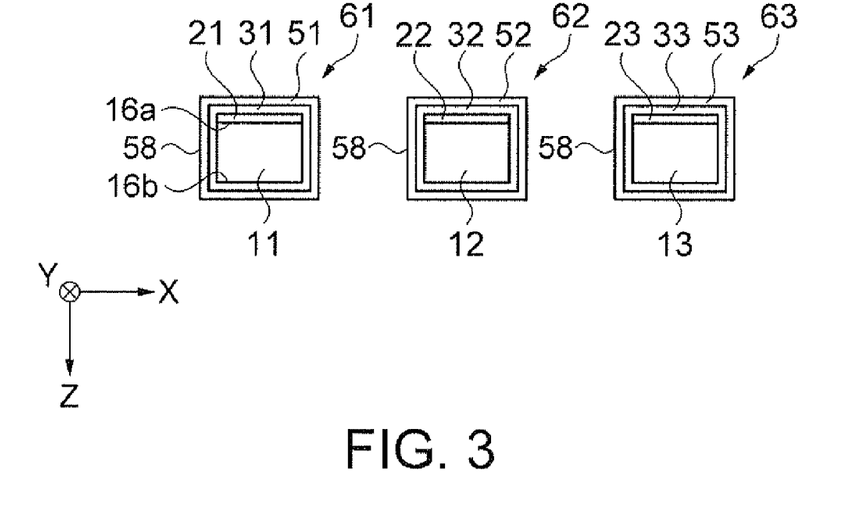
FIG. 3 is a schematic sectional view showing a configuration of piezoelectric elements according to the first embodiment.
Figure 4:
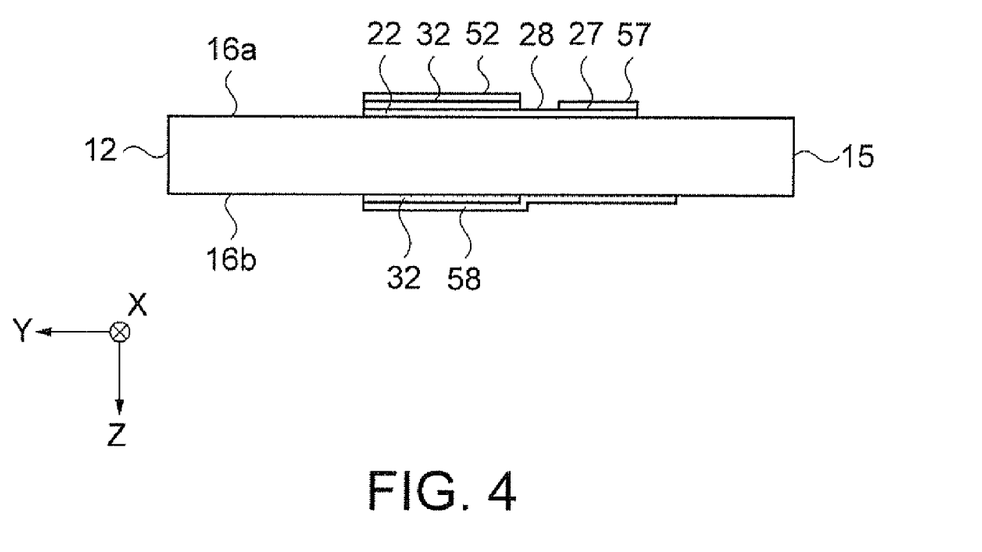
FIG. 4 is a schematic sectional view taken along a line B-B of FIG. 1, and shows a configuration of the resonator element according to the first embodiment.

FIG. 1 is a schematic plan view showing a configuration of a resonator element according to a first embodiment. FIG. 2 is a schematic plan view showing a configuration of a back surface of the resonator element of FIG. 1. FIG. 3 is a schematic sectional view taken along the line A-A of FIG. 1, and shows a configuration of piezoelectric elements. FIG. 4 is a schematic sectional view taken along the line B-B of FIG. 1.

As shown in FIGS. 1 and 2, a resonator element 1 is formed by employing a base material such as quartz crystal or silicon. The resonator element 1 is in a manner such that a thickness direction thereof is in a Z-direction when the resonator element 1 is developed in an XY-plane in an orthogonal coordinate system. The resonator element 1 has three resonating arms 11, 12, and 13 arranged in an X-direction while extending in parallel with one another in a Y-direction. The resonating arms 11, 12, and 13 are connected to a base 15, so that the resonator element 1 has a cantilever structure supporting the resonating arms. A first surface 16*a* and a second surface 16*b* of each of the resonating arms are opposed to each other in the Z-direction. A dimension between the first and second surfaces 16*a* and 16*b* determines a thickness of the resonating arm.

The resonating arms 11, 12, and 13 respectively include piezoelectric elements 61, 62, and 63 in a position close to the base 15.

As shown in FIG. 3, a lower electrode 21, a piezoelectric film 31, and an upper electrode 51 are stacked on the resonating arm 11 so as to form the piezoelectric element 61.

The lower electrode 21 is provided on the first surface 16*a*. A width of the lower electrode 21 is the same as that of the resonating arm 11. The piezoelectric film 31 is formed on the lower electrode 21, side surfaces of the resonating arm 11, and the second surface 16*b* so as to cover the lower electrode 21 and surround the perimeter of the resonating arm 11. Covering the piezoelectric film 31, the upper electrode 51 is formed. A wiring line 58 coupled to the upper electrode 51 is drawn out to the second surface 16*b* through the side surfaces of the resonating arm 11 so as to surround the resonating arm 11.

The piezoelectric element 61 is formed by the lower electrode 21 and the upper electrode 51 opposed to each other across the piezoelectric film 31. The piezoelectric film 31 can expand and contract when a positive and negative voltage is applied between the electrodes. The piezoelectric film 31 expands and contracts, thereby is it possible to displace the resonating arm 11 in the Z-direction.

Similarly, the piezoelectric element 62 is formed by stacking a lower electrode 22, a piezoelectric film 32, and an upper electrode 52 while the piezoelectric element 63 is formed by stacking a lower electrode 23, a piezoelectric film 33, and an upper electrode 53. The wiring line 58 coupled to the upper electrode 52 is drawn out to the second surface 16*b* through side surfaces of the resonating arm 12 so as to surround the resonating arm 12, and the wiring line 58 coupled to the upper electrode 53 is drawn out to the second surface 16*b* through side surfaces of the resonating arm 13 so as to surround the resonating arm 13.

Here, the respective lower electrodes, the respective upper electrodes, a wiring line 28 coupled to each of the lower electrodes, and the wiring line 28 coupled to each of the upper electrodes are sequentially formed. Thus, in the description of the embodiment, the lower electrode and the upper electrode are respectively referred to as portions overlapping each other across the piezoelectric film. The rest of the lower electrode is referred to the wiring line 28 while the rest of the upper electrode is referred to as the wiring line 58.

Further, an insulating film, such as $SiO_2$ or $Si_2N_3$, may be provided between the lower electrode and the upper electrode. Accordingly, it is possible to securely prevent electrical short circuits between the lower electrode and the upper electrode.

As shown in FIGS. 1, 2, and 4, the wiring lines 28 coupled to the respective lower electrodes and the wiring lines 58 coupled to the respective upper electrodes are drawn out to the base 15 of the resonator element 1, and coupled to mounting electrodes 65 and 66. The mounting electrodes 65 and 66 are fixed to a base of a package, for example, so as to provide electrical conductivity. A connection 57 coupling the lower electrode 22 to the upper electrodes 51 and 53 is provided so that the piezoelectric elements 61 and 63 have an opposite polarity from the piezoelectric element 62.

The lower and upper electrodes can be formed of a metal material such as Au, Al, or Ti. A Cr film may be provided between each electrode and its underlayer so as to improve adhesion strength therebetween. The piezoelectric film can be formed of a material such as ZnO, AlN, PZT, $LiNbO_3$, or $KNbO_3$. Specifically, it is preferable to employ ZnO or AlN since better characteristics are obtained.

In a case where quartz crystal is employed as a base material of the resonator element 1, it is possible to utilize an X-cut plate, an AT-cut plate, a Z-cut plate, or the like.

Configuration of Wiring Lines Coupled to Lower Electrodes and Upper Electrodes

The wiring lines coupled to the lower electrodes and the wiring lines coupled to the upper electrodes of the above-described resonator element 1 will be described in detail.

Figure 5A:
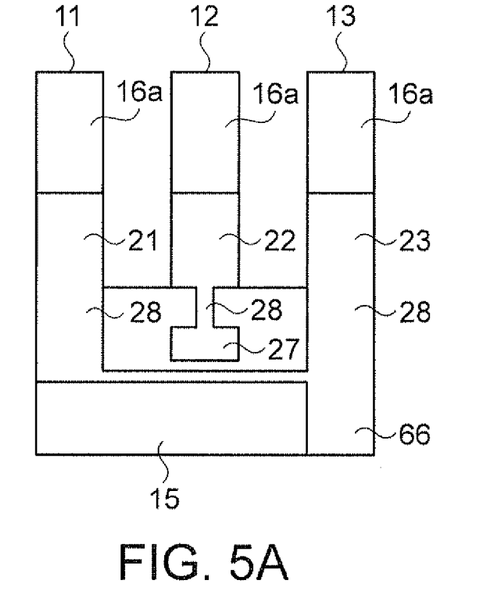
Figure 5B:
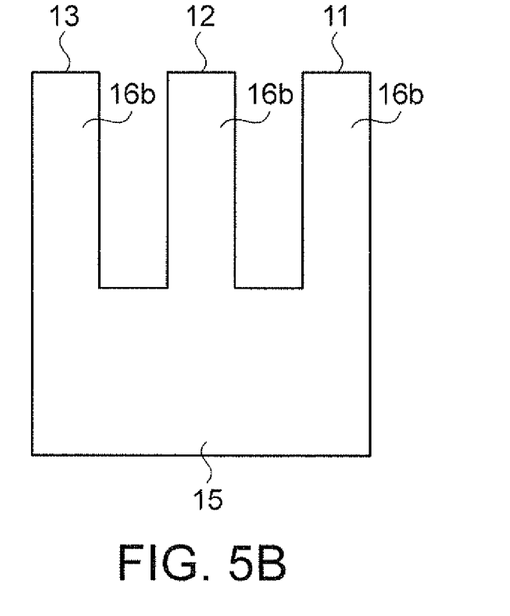
FIG. 5B is a schematic plan view showing a back surface.
Figure 6A:
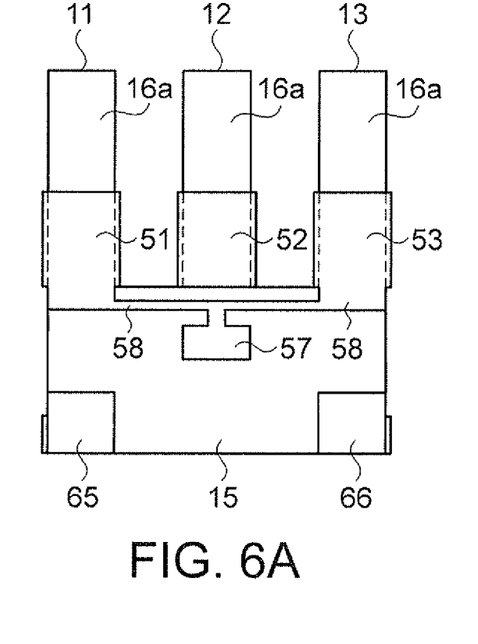
FIGS. 6A and 6B show wiring lines coupled to upper electrodes.
Figure 6B:
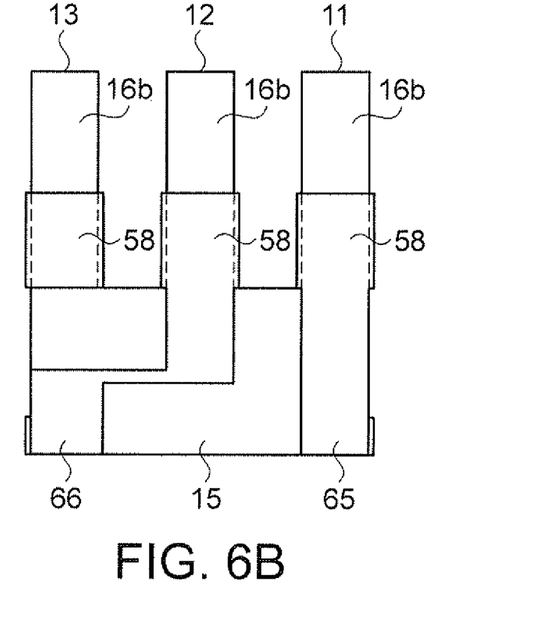

FIGS. 5A and 5B show the wiring lines coupled to the lower electrodes. FIG. 5A is a schematic plan view showing a front surface while FIG. 5B is a schematic plan view showing a back surface. FIGS. 6A and 6B show the wiring lines coupled to the upper electrodes. FIG. 6A is a schematic plan view showing a front surface while FIG. 6B is a schematic plan view showing a back surface.

As shown in FIG. 5A, the lower electrodes 21, 22, and 23 are provided on the first surface 16*a*.

The wiring line 28 is drawn out to the base 15 from the lower electrode 22, which is co-planer with the base 15, formed on the resonating arm 12, and is coupled to a connection 27. The wiring lines 28 are drawn out from the lower electrodes 21 and 23, which are co-planer with the base 15, formed on the resonating arms 11 and 13, respectively, are coupled to the base 15. Further, these wiring lines 28 are coupled to the mounting electrode 66. As shown in FIG. 5B, no wiring line is formed on the other surface (the back surface).

As shown in FIG. 6A, each upper electrode is formed on a position covering the lower electrode. The wiring line 58 coupled to the upper electrode is drawn out to the second surface 16*b* through the side surfaces of the resonating arm so as to surround the resonating arm.

On the front surface of the resonator element, as shown in FIG. 6A, the wiring lines 58 are drawn out to the base 15 from the upper electrodes 51 and 53 formed above the resonating arms 11 and 13, respectively, and coupled to the connection 57.

Meanwhile, on the back surface of the resonator element, the wiring line 58 is drawn out to the base 15 from the upper electrodes 52 formed above the resonating arm 12, and coupled to the mounting electrode 66 as shown in FIG. 6B. The mounting electrode 66 is laid out to the front surface of the resonator element by a wiring line formed on a side surface of the base 15, thereby the mounting electrode 66 is provided on each of the front and back surfaces of the resonator element.

Further, the wiring line 58 is drawn out to the base 15 from the upper electrode 51 formed above the resonating arm 11, and coupled to the mounting electrode 65. The mounting electrode 65 is laid out to the front surface of the resonator element by a wiring line formed on the side surface of the base 15, thereby the mounting electrode 65 is provided on each of the front and back surfaces of the resonator element.

The wiring lines 28 respectively coupled to the lower electrodes and the wiring lines 58 respectively coupled to the upper electrodes are thus configured. The connection 27 in the lower electrode side is coupled to the connection 57 in the upper electrode side, coupling the lower electrode 22 to the upper electrodes 51 and 53. Further, the lower electrode 22 is coupled to the mounting electrode 65 in the upper electrode side through the upper electrode 51. In this way, the lower electrode 22 and the upper electrodes 51 and 53 are coupled to the mounting electrode 65.

Further, the mounting electrode 66 in the lower electrode side is coupled to the mounting electrode 66 in the upper electrode side, so that the lower electrodes 21 and 23 are coupled to the upper electrode 52. In this way, the lower electrodes 21 and 23 and the upper electrode 52 are coupled to the mounting electrode 66.

Figure 7:
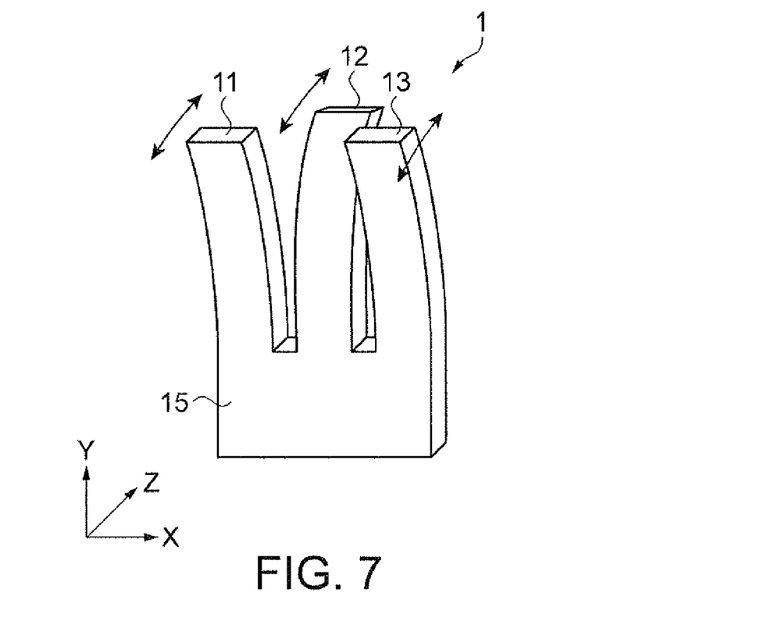
FIG. 7 is a schematic diagram showing an operation of the resonator element according to the first embodiment.

FIG. 7 is a schematic diagram showing an operation of the resonator element according to the first embodiment.

In the resonator element 1 having the above-described configuration, the resonating arms are displaced in the Z-direction when a voltage is applied to each piezoelectric element (not shown). Since the piezoelectric element having the same polarity is provided to the resonating arms 11 and 13, the resonating arm 12 at the center vibrates in an opposite direction from the resonating arms 11 and 13 at both sides of the resonating arm 12. The resonating arms perform walk-mode vibration in which the resonating arms adjacent to each other alternately vibrate in opposite directions from each other when an alternating-current is applied.

As described above, in the resonator element 1 of the embodiment, the wiring line 58 coupled to the upper electrode is drawn out to the second surface 16b through the side surfaces of the resonating arm so as to surround the resonating arm.

The wiring line 58 is drawn out from the first surface 16a of the resonating arm to the second surface 16b, which is the back surface of the first surface 16a. Thus, it is possible to easily draw out the wiring line 58 to the back surface. The wiring line 58 can be arranged on the each of the front and back surfaces of the resonating arm, increasing an area that can be used for the arrangement of the wiring line 58. As a result, the degree of arrangement freedom of the wiring line 58 is increased. Furthermore, it is possible to arrange the wiring line 58 in a limited space, being able to achieve miniaturization of the resonator element 1.

Modification

The electrodes and the arrangement of wiring lines of the embodiment are also applicable in a resonator element in which the base is formed thicker than the resonating arm.

Figure 8A:
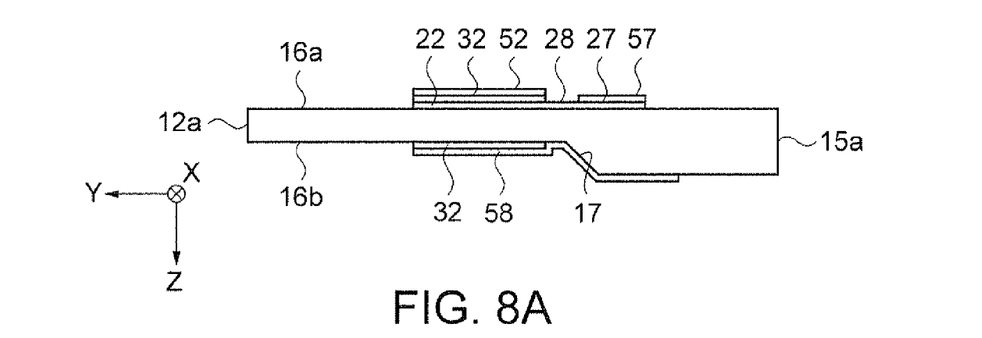
FIGS. 8A and 8B are schematic sectional views showing modifications of the resonating arm in which a base is formed thicker than the resonating arm according to the first embodiment.
Figure 8B:
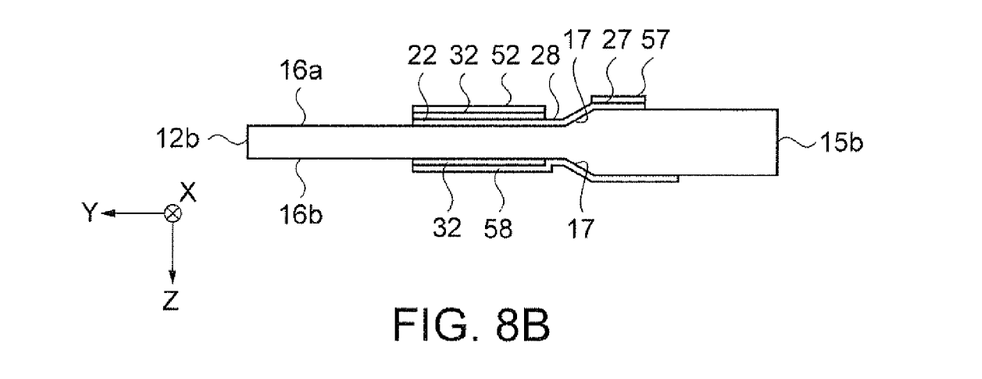

FIGS. 8A and 8B are schematic sectional views showing modifications of the resonating arm in which the base is formed thicker than the resonating arm. Each of the sectional views corresponds to FIG. 4 described above.

In the modifications, the planer shape of the resonator element and the configurations of the upper electrode, the piezoelectric film, the lower electrode, and the wiring lines formed on the resonator element are the same as those of the first embodiment, and only the sectional shape of the resonator element is different from that of the first embodiment.

Note that elements same as those of the first embodiment are denoted by the same numerals, and detailed descriptions thereof will be omitted.

In a resonator element shown in FIG. 8A, the first surface 16a of a resonating arm 12a has a flat surface from the resonating arm 12a to a base 15a while the second surface 16b of the resonating arm 12a is formed so as to extend from the resonating arm 12a to the base 15a through an inclined surface 17 formed at a portion of the base 15a. The inclined surface 17 is thus provided to the second surface 16b of the resonating arm 12a, so that the thickness of the resonating arm continuously increases toward the end of the base 15a from the resonating arm 12a. The wiring line 58 coupled to the upper electrode 52 is arranged on the inclined surface 17.

In a resonator element shown in FIG. 8B, the first surface 16a of a resonating arm 12b is connected to a base 15b through the inclined surface 17 formed at a portion of the base 15b and the second surface 16b of the resonating arm 12b is connected to the base 15b through the inclined surface 17 formed at a portion of the base 15b. The inclined surface 17 is thus provided to each of the first and second surfaces 16a and 16b, so that the thickness of the resonating arm continuously increases toward the end of the base 15b from the resonating arm 12b. The wiring line 28 coupled to the lower electrode 22 is arranged on the inclined surface 17 provided to the first surface 16a while the wiring line 58 coupled to the upper electrode 52 is arranged on the inclined surface 17 provided to the second surface 16b.

As described above, in the resonator element in which the base is formed thicker than the resonating arm, the connecting portion between the base and the resonating arm forms the inclined surface 17. The wiring line 58 laid out to the base 15a from the resonating arm 12a and the wiring lines 28 and 58 laid out to the base 15b from the resonating arm 12b pass through the inclined surface 17 so as to be coupled to the mounting electrode and the like.

In a case where the resonating arm and the base is connected without forming the above-described inclined surface 17, a step is formed at a boundary between the resonating arm and the base. In the modifications, since the connecting portion has the inclined surface 17, the wiring lines 28 and 58 do not cross a sharp edge compared with a case where the wiring lines 28 and 58 cross the step. Consequently, it is possible to prevent disconnections of the wiring lines 28 and 58 at the connecting portion. In addition, since no step is formed at the connecting portion between the resonating arm and the base, exposure of photoresist is securely performed in a case where photolithography is employed for forming the wiring lines 28 and 58. As a result, the wiring lines 28 and 58 can be easily formed without any disconnection.

Second Embodiment

A resonator element according to a second embodiment will be described. In the present embodiment, an arrangement of wiring lines respectively coupled to the upper electrodes and the lower electrodes is different from that of the first embodiment.

Figure 9:
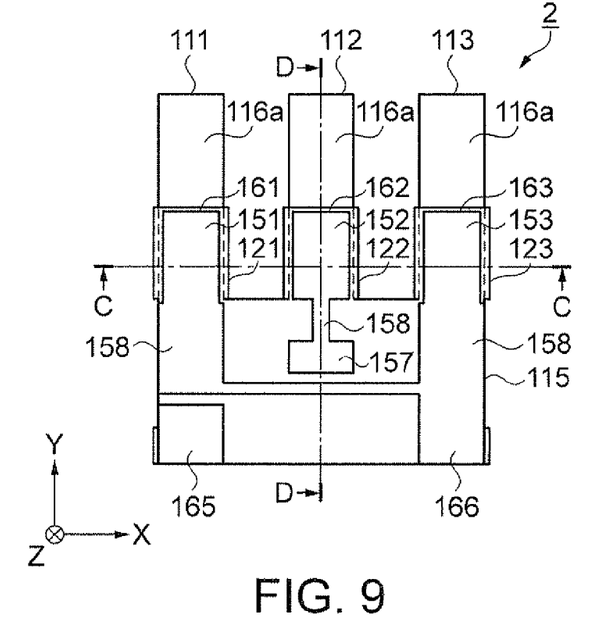
FIG. 9 is a schematic plan view showing a configuration of a resonator element according to a second embodiment.
Figure 10:
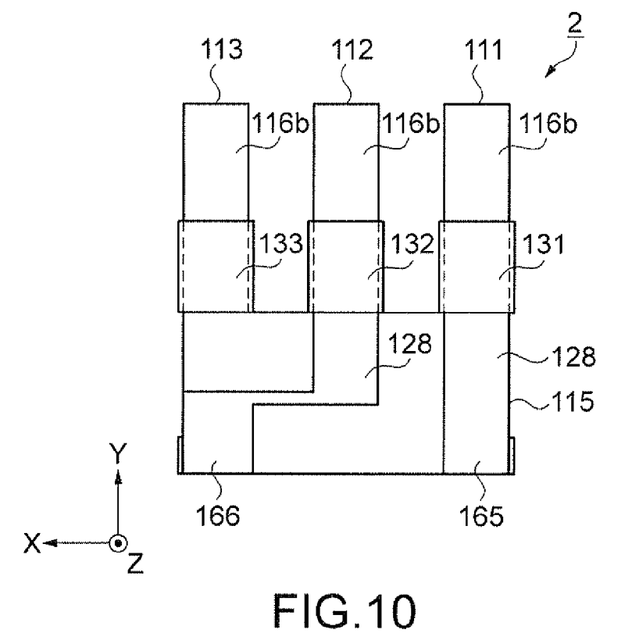
FIG. 10 is a schematic plan view showing a configuration of a back surface of the resonator element according to the second embodiment.
Figure 11:
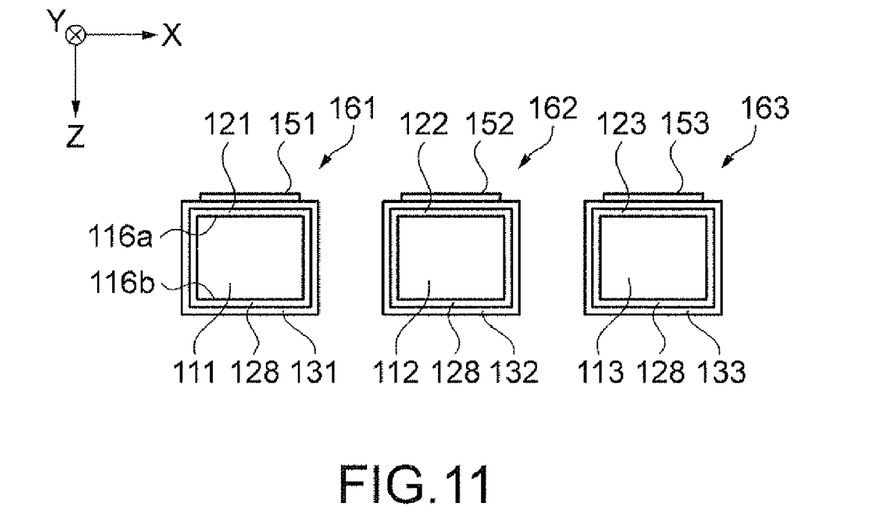
FIG. 11 is a schematic sectional view showing a configuration of piezoelectric elements according to the second embodiment.
Figure 12:
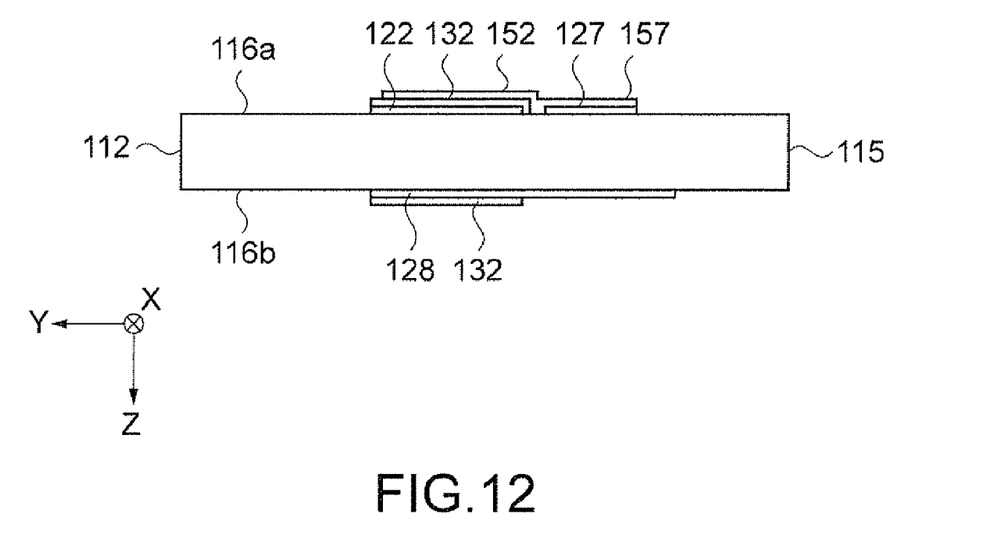
FIG. 12 is a schematic sectional view taken along a line D-D of FIG. 9, and shows a configuration of the resonator element according to the second embodiment.

FIG. 9 is a schematic plan view showing a configuration of a resonator element according to the embodiment. FIG. 10 is a schematic plan view showing a configuration of a back surface of the resonator element of FIG. 9. FIG. 11 is a schematic sectional view taken along the line C-C of FIG. 9, and shows a configuration of piezoelectric elements. FIG. 12 is a schematic sectional view taken along the line D-D of FIG. 9.

As shown in FIGS. 9 and 10, a resonator element 2 is formed by employing a base material such as quartz crystal or silicon. The resonator element 2 is in a manner such that a thickness direction thereof is in the Z-direction when the resonator element 2 is developed in an XY-plane in an orthogonal coordinate system. The resonator element 2 has three resonating arms 111, 112, and 113 arranged in the X-direction while extending in parallel with one another in the Y-direction. The resonating arms 111, 112, and 113 are connected to a base 115, so that the resonator element 2 has a cantilever structure supporting the resonating arms. A first surface 116a and a second surface 116b of each of the resonating arms are opposed to each other in the Z-direction. A dimension between the first and second surfaces 116a and 116b determines a thickness of the resonating arm.

The resonating arms 111, 112, and 113 respectively include piezoelectric elements 161, 162, and 163 in a position close to the base 115.

As shown in FIG. 11, a lower electrode 121, a piezoelectric film 131, and an upper electrode 151 are stacked on the resonating arm 111 so as to form the piezoelectric element 161.

The lower electrode 121 is provided on the first surface 116a. A wiring line 128 coupled to the lower electrode 121 is drawn out to the second surface 116b through side surfaces of the resonating arm 111 so as to surround the resonating arm 111. The piezoelectric film 131 is formed on the lower electrode 121 so as to cover the lower electrode 121 and surround the perimeter of the resonating arm 111. The upper electrode 151 is provided at a position above the lower electrode 121 of the piezoelectric film 31.

The piezoelectric element 161 is formed by the lower electrode 121 and the upper electrode 151 opposed to each other across the piezoelectric film 131. The piezoelectric film 131 can expand and contract when a positive and negative voltage is applied between the electrodes. The piezoelectric film 131 expands and contracts, thereby is it possible to displace the resonating arm 111 in the Z-direction.

Similarly, the piezoelectric element 162 is formed by stacking a lower electrode 122, a piezoelectric film 132, and an upper electrode 152 while the piezoelectric film 163 is formed by stacking a lower electrode 123, a piezoelectric film 133, and an upper electrode and 153. The wiring line 128 coupled to the lower electrode 122 is drawn out to the second surface 116b through side surfaces of the resonating arm 112, and the wiring line 128 coupled to the lower electrode 123 is drawn out to the second surface 116b through side surfaces of the resonating arm 113.

Here, the respective lower electrodes, the respective upper electrodes, the wiring line 128 coupled to each of the lower electrodes, and wiring line 158 coupled to each of the upper electrodes are sequentially formed. Thus, in the description of the embodiment, the lower electrode and the upper electrode are respectively referred to as portions overlapping each other across the piezoelectric film. The rest of the lower electrode is referred to as the wiring line 128 while the rest of the upper electrode is referred to as the wiring line 158.

Further, an insulating film, such as $SiO_2$ or $Si_3N_4$, may be provided between the lower electrode and the upper electrode. Accordingly, it is possible to securely prevent electrical short circuits between the lower electrode and the upper electrode.

As shown in FIGS. 9, 10, and 12, the wiring lines 128 coupled to the respective lower electrodes and the wiring lines 158 coupled to the respective upper electrodes are drawn out to the base 115 of the resonator element 2, and coupled to mounting electrodes 165 and 166. The mounting electrodes 165 and 166 are fixed to a base of a package, for example, so as to provide electrical conductivity. A connection 157 coupling the lower electrodes 121 and 123 to the upper electrode 152 is provided so that the piezoelectric elements 161 and 163 have an opposite polarity from the piezoelectric element 162.

The lower and upper electrodes can be formed of a metal material such as Au, Al, or Ti. A Cr film may be provided between each electrode and its underlayer so as to improve adhesion strength therebetween. The piezoelectric film can be formed of a material such as ZnO, AlN, PZT, $LiNbO_3$, or $KNbO_3$. Specifically, it is preferable to employ ZnO or AlN since better characteristics are obtained.

In a case where quartz crystal is employed as a base material of the resonator element 2, it is possible to utilize an X-cut plate, an AT-cut plate, a Z-cut plate, or the like.

Configuration of Wiring Lines Coupled to Lower Electrodes and Upper Electrodes

The wiring lines coupled to the lower electrodes and the wiring lines coupled to the upper electrodes of the above-described resonator element 2 will be described in detail.

Figure 13A:
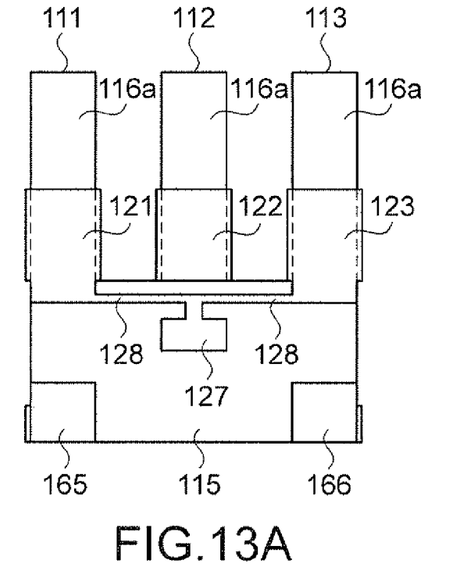
Figure 13B:
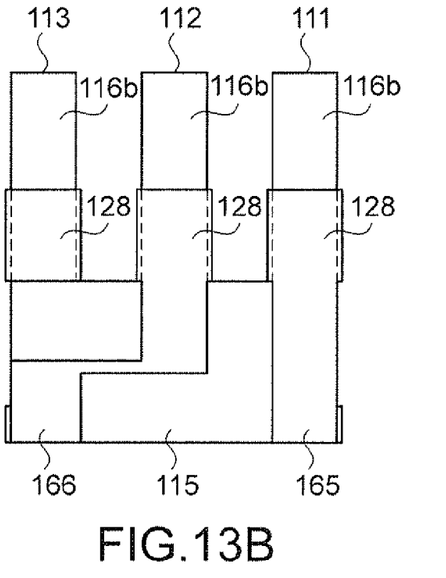
FIG. 13B is a schematic plan view showing a back surface.
Figure 14A:
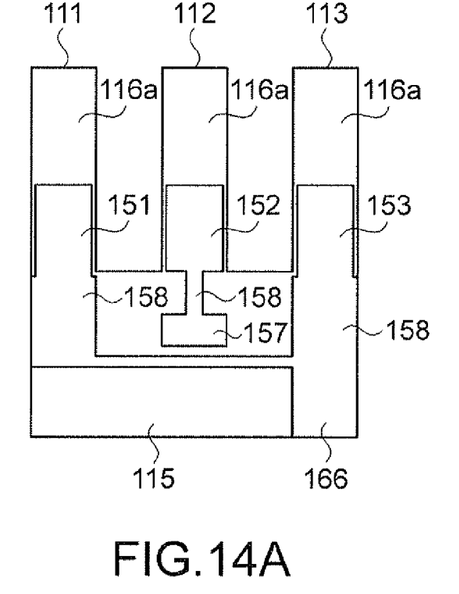
Figure 14B:
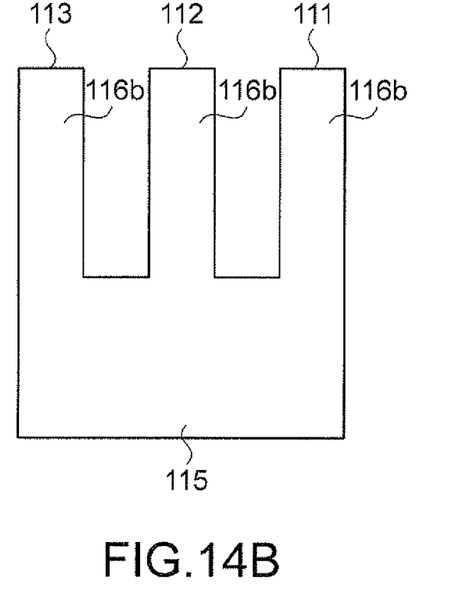
FIG. 14B is a schematic plan view showing a back surface.

FIGS. 13A and 13B show the wiring lines coupled to the lower electrodes. FIG. 13A is a schematic plan view showing a front surface while FIG. 13B is a schematic plan view showing a back surface. FIGS. 14A and 14B show the wiring lines coupled to the upper electrodes. FIG. 14A is a schematic plan view showing a front surface while FIG. 14B is a schematic plan view showing a back surface.

As shown in FIG. 13A, the lower electrodes 121, 122, and 123 are provided on the first surface 116a.

On the front surface of the resonator element, as shown in FIG. 13A, the wiring lines 128 are drawn out to the base 115 from the lower electrodes 121 and 123 formed on the resonating arms 111 and 113, respectively, and coupled to the connection 127.

Meanwhile, on the back surface of the resonator element, the wiring line 128 is drawn out to the base 115 from the lower electrodes 122 formed on the resonating arm 112, and coupled to the mounting electrode 166 as shown in FIG. 13B. The mounting electrode 166 is laid out to the front surface of the resonator element by a wiring line formed on a side surface of the base 115, thereby the mounting electrode 166 is provided on each of the front and back surfaces of the resonator element.

Further, the wiring line 128 is drawn out to the base 115 from the lower electrode 121, which is co-planer with the base 115, formed on the resonating arm 111, and coupled to the mounting electrode 165. The mounting electrode 165 is laid out to the front surface of the resonator element by a wiring line formed on the side surface of the base 115, thereby the mounting electrode 165 is provided on the each of the front and back surfaces of the resonator element.

Each upper electrode is formed on a position above the lower electrode.

As shown in FIG. 14A, the wiring line 158 is drawn out to the base 115 from the upper electrode 152, which is co-planer with the base 115, formed above the resonating arm 112, and coupled to a connection 157. The wiring lines 158 are drawn out from the upper electrodes 151 and 153, which are co-planer with the base 115, formed above the resonating arms 111 and 113, respectively, and coupled to the base 115. Further, these wiring lines 158 are coupled to the mounting electrode 166. As shown in FIG. 14B, no wiring line is formed on the other surface (the back surface).

The wiring lines 128 respectively coupled to the lower electrodes and the wiring lines 158 respectively coupled to the lower electrodes are thus configured. The connection 127 in the lower electrode side is coupled to the connection 157 in the upper electrode side, coupling the lower electrodes 121 and 123 to the upper electrodes 152. Then, the upper electrode 122 is coupled to the mounting electrode 165 through the lower electrode 121. In this way, the lower electrodes 121 and 123 and the upper electrode 152 are coupled to the mounting electrode 165.

Further, the mounting electrode 166 in the lower electrode side is coupled to the mounting electrode 166 in the upper electrode side, so that the lower electrode 122 is coupled to the upper electrodes 151 and 153. In this way, the lower electrode 122 and the upper electrodes 151 and 153 are coupled to the mounting electrode 166.

In the resonator element 2 having the above-described configuration, the resonating arms are displaced in the Z-direction when a voltage is applied to each piezoelectric element in the same manner as the description of FIG. 7. Since the piezoelectric element having the same polarity is provided to the resonating arms 111 and 113, the resonating arm 112 at the center vibrates in an opposite direction from the resonating arms 111 and 113 at both sides of the resonating arm 112. The resonating arms perform walk-mode vibration in which the resonating arms adjacent to each other alternately vibrate in opposite directions from each other when an alternating-current is applied.

As described above, in the resonator element 2 of the embodiment, the wiring line 128 coupled to the lower electrode is drawn out to the second surface 116b from the first surface 116a through the side surfaces of the resonating arm so as to surround the resonating arm.

The wiring line 128 is drawn from the first surface 116a of the resonating arm to the second surface 116b, which is the back surface of the first surface 16a. Thus, it is possible to easily draw out the wiring line 128 to the back surface. Further, the wiring line 128 can be arranged on the each of the front and back surfaces of the resonator element 2, increasing an area that can be used for the arrangement of the wiring line 128. As a result, the degree of arrangement freedom of the wiring line 128 is increased. Furthermore, it is possible to arrange the wiring line 128 in a limited space, being able to achieve miniaturization of the resonator element 2.

Modification

The electrodes and the arrangement of wiring lines of the embodiment are also applicable in a resonator element in which the base is formed thicker than the resonating arm.

Figure 15A:
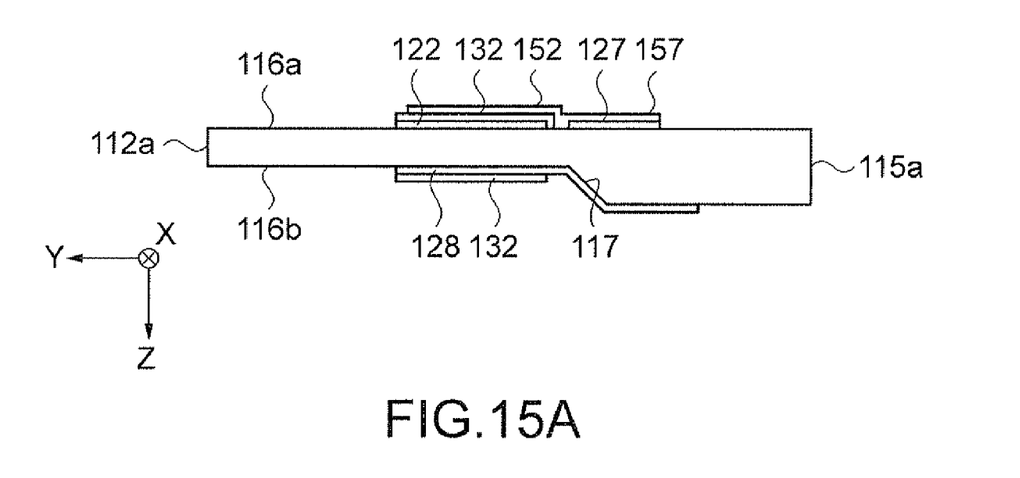
FIGS. 15A and 15B are schematic sectional views showing modifications of a resonating arm in which a base is formed thicker than the resonating arm according to the second embodiment.
Figure 15B:
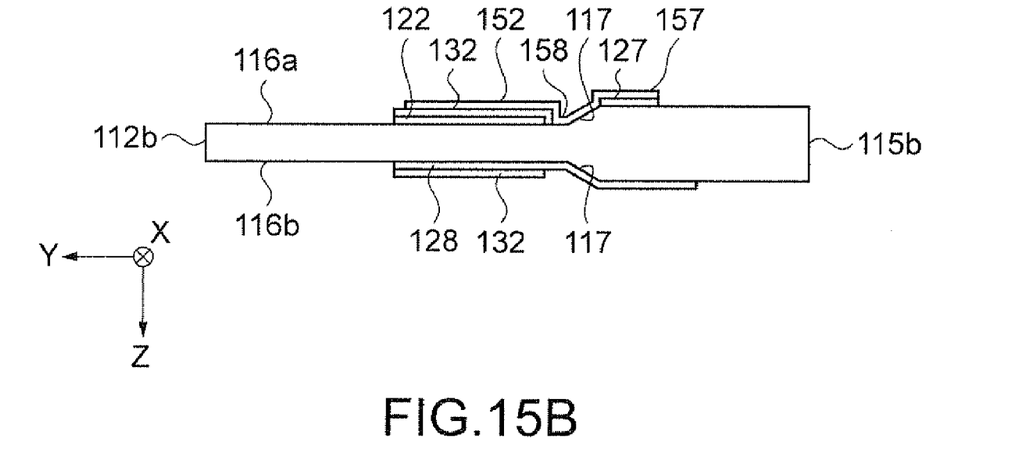

FIGS. 15A and 15B are schematic sectional views showing modifications of the resonating arm in which the base is formed thicker than the resonating arm. Each of the sectional views corresponds to FIG. 12 described above.

In the modifications, the planer shape of the resonator element and the configurations of the upper electrode, the piezoelectric film, the lower electrode, and the wiring lines formed on the resonator element are the same as those of the second embodiment, and only the sectional shape of the resonator element is different from that of the first embodiment.

Note that elements same as those of the second embodiment are denoted by the same numerals, and detailed descriptions thereof will be omitted.

In a resonator element shown in FIG. 15A, the first surface 116a of a resonating arm 112a has a flat surface from the resonating arm 112a to a base 115a while the second surface 116b of the resonating arm 112a is formed so as to extend from the resonating arm 112a to the base 115a through an inclined surface 117 formed at a portion of the base 115a. The inclined surface 117 is thus provided to the second surface 116b of the resonating arm 112a, so that the thickness of the resonating arm continuously increases toward the end of the base 115a from the resonating arm 112a. The wiring line 128 coupled to the lower electrode 122 is arranged on the inclined surface 117.

In a resonator element shown in FIG. 15B, the first surface 116a of a resonating arm 112b is connected to a base 115b through the inclined surface 117 formed at a portion of the base 115b and the second surface 116b of the resonating arm 112b is connected to the base 115b through the inclined surface 117 formed at a portion of the base 115b. The inclined surface 117 is thus provided to each of the first and second surfaces 116a and 116b, so that the thickness of the resonating arm continuously increases toward the end of the base 115b from the resonating arm 112b. The wiring line 158 coupled to the upper electrode 152 is arranged on the inclined surface 117 provided to the first surface 116a while the wiring line 128 coupled to the lower electrode 122 is arranged on the inclined surface 117 provided to the second surface 116b.

As described above, in the resonator element in which the base is formed thicker than the resonating arm, the connecting portion between the base and the resonating arm forms the inclined surface 117. The wiring line 128 laid out to the base 115a from the resonating arm 112a and the wiring lines 128 and 158 laid out to the base 115b from the resonating arm 112b pass through the inclined surface 117 so as to be coupled to the mounting electrode and the like.

In a case where the resonating arm and the base is connected without forming the above-described inclined surface 117, a step is formed at a boundary between the resonating arm and the base. In the modifications, since the connecting portion has the incline surface 117, the wiring lines 128 and 158 do not cross a sharp edge compared with a case where the wiring lines 128 and 158 cross the step. Consequently, it is possible to prevent disconnections of the wiring lines 128 and 158 at the connecting portion. In addition, since no step is formed at the connecting portion between the resonating arm and the base, exposure of photoresist is securely performed in a case where photolithography is employed for forming the wiring lines 128 and 158. As a result, the wiring lines 128 and 158 can be easily formed without any disconnection.

The resonator element having three resonating arms is described in the first and second embodiments. However, the number of resonating arms it not limited to that of the embodiments as long as it is equal to or larger than three, preferably an odd number equal to or larger than three.

Third Embodiment

As a third embodiment, a resonator equipped with the above-described resonator element will be described.

Figure 16A:
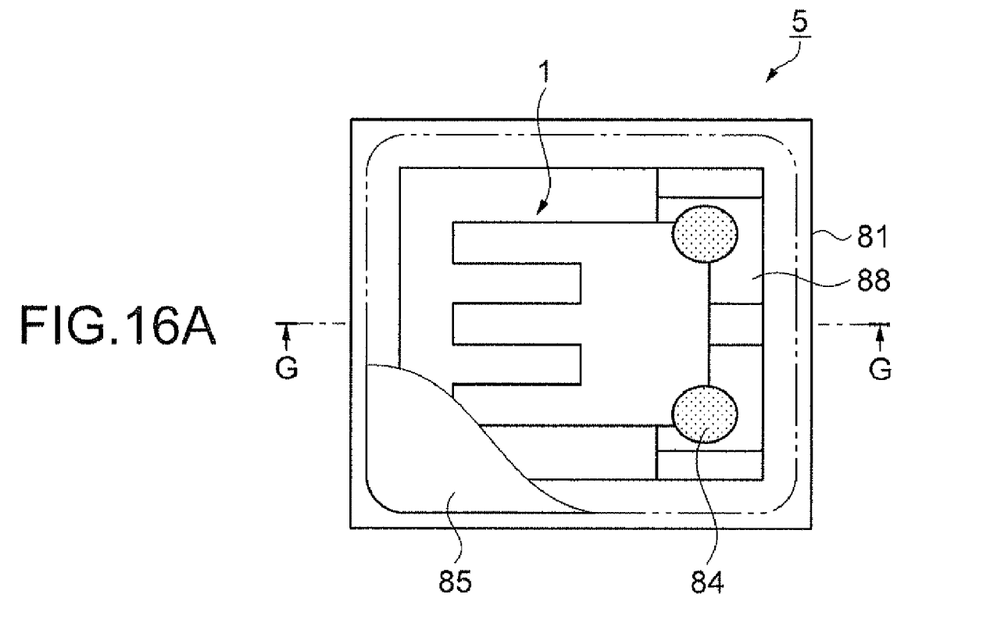
Figure 16B:
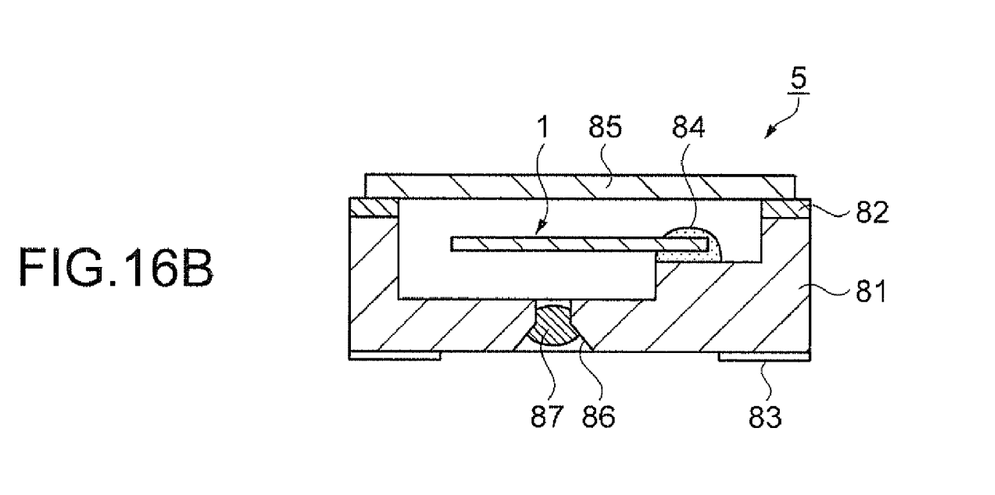
FIG. 16B is a schematic sectional view.

FIGS. 16A and 16B show a configuration of the resonator. FIG. 16A is a schematic plan view while FIG. 16B is a schematic sectional view taken along the line G-G of FIG. 16A.

A resonator 5 includes the resonator element 1, a ceramic package 81 serving as a container, and a lid 85.

The ceramic package 81 has a recess for housing the resonator element 1. In the recess, a connection pad 88 coupled to the mounting electrodes of the resonator element 1 is provided. The connection pad 88 is coupled to a wiring line in the ceramic package 81, and conductively coupled to an external connection terminal 83 provided to an outer periphery of the ceramic package 81.

On a periphery of the recess of the ceramic package 81, a seam ring 82 is provided. Further, a through-hole 86 is provided at a bottom of the ceramic package 81.

The resonator element 1 is bonded and fixed to the connection pad 88 of the ceramic package 81 with a conductive adhesive 84. The lid 85 covering the recess of the ceramic package 81 is seam-welded to the seam ring 82. A sealant 87 formed of a metal material fills the through-hole 86 of the ceramic package 81. The sealant 87 is melted in a reduced pressure atmosphere and hermetically seals the through-hole so that the inside of the ceramic package 81 is in a reduced pressure condition.

In this way, the resonator element of the first or second embodiment is housed in the ceramic package 81. As a result, it is possible to provide the resonator 5 that can be easily miniaturized and has excellent characteristics.

Additionally, it may be possible to configure an oscillator by housing a circuit element, such as an IC including an oscillation circuit, in the ceramic package 81.

The entire disclosure of Japanese Patent Application No. 2009-029895, filed Feb. 12, 2009 is expressly incorporated by reference herein.

What is claimed is:

1. A resonator element, comprising:
   three or more resonating arms, each of the resonating arms including:
      a lower electrode provided above a first surface of the resonating arm;
      a piezoelectric film formed above an upper side of the lower electrode;
      an upper electrode formed above an upper side of the piezoelectric film;
      a first wiring line coupled to the lower electrode; and
      a second wiring line coupled to the upper electrode; and
   a base to which the resonating arms are connected,
   wherein the resonating arm vibrates in a thickness direction of the resonating arm,
   wherein the resonating arms adjacent to each other vibrate in opposite directions from each other,
   wherein the first surface is opposed to a second surface in the thickness direction, and
   wherein the second wiring line is drawn out to the second surface through side surfaces of the resonating arm so as to surround the resonating arm with the second wiring line.

2. The resonator element according to claim 1, wherein a mounting electrode coupled to the first and second wiring lines is formed at an end of the base.

3. The resonator element according to claim 2, wherein the base is formed thicker than the resonating arm, and a portion of the base at which the resonating arm is connected to the base is formed such that a thickness of the portion continuously increases from the resonating arm toward the base.

4. A resonator element, comprising:
   three or more resonating arms, each of the resonating arms including:
      a lower electrode provided above a first surface of the resonating arm;
      a piezoelectric film formed above the lower electrode;
      an upper electrode formed above the piezoelectric film;
      a first wiring line coupled to the lower electrode; and
      a second wiring line coupled to the upper electrode; and
   a base to which the resonating arms are connected,
   wherein the resonating arm vibrates in a thickness direction of the resonating arm,
   wherein the resonating arms adjacent to each other vibrate in opposite directions from each other,
   wherein the first surface is opposed to a second surface in the thickness direction, and
   wherein the first wiring line is drawn out to the second surface through side surfaces of the resonating arm so as to surround the resonating arm.

5. The resonator element according to claim 4, wherein a mounting electrode coupled to the first and second wiring lines is formed at an end of the base.

6. The resonator element according to claim 5, wherein the base is formed thicker than the resonating arm, and a portion of the base at which the resonating arm is connected to the base is formed such that a thickness of the portion continuously increases from the resonating arm toward the base.

7. A resonator, comprising:
   the resonator element according to claim 1; and
   a container housing the resonator,
   wherein the resonator element is hermetically housed in the container.

* * * * *